Jan. 1, 1957 W. YUNI 2,776,343
MULTI-PURPOSE VACUUM TUBE VARIABLE GAIN AMPLIFIER
Filed May 4, 1953
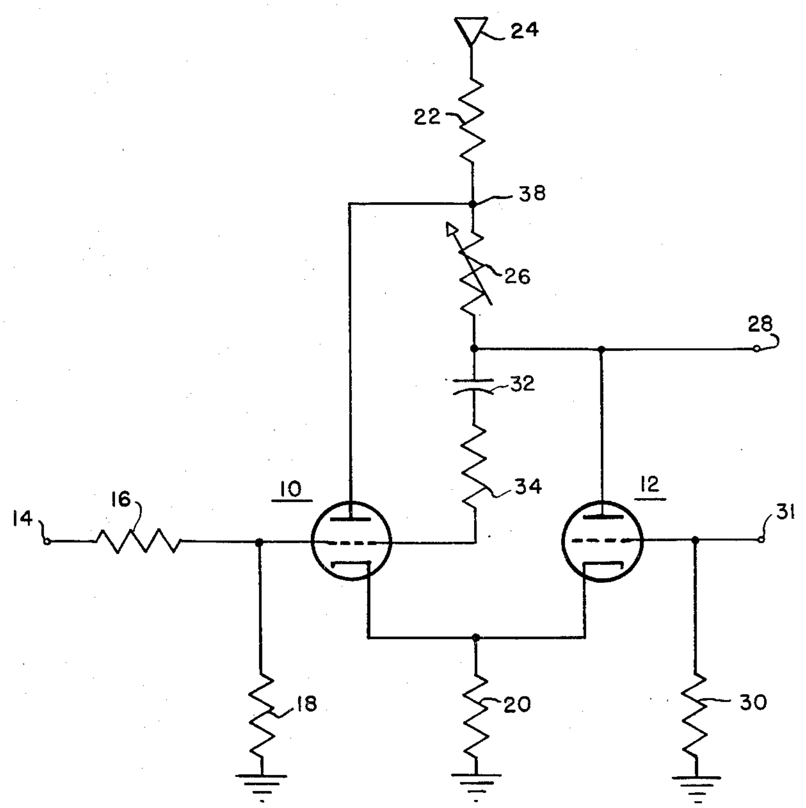
INVENTOR.
WILLIAM YUNI
BY
Harry M. Saragovitz
ATTORNEY United States Patent Office 2,776,343

Patented Jan. 1, 1957

2,776,343

MULTI-PURPOSE VACUUM TUBE VARIABLE GAIN AMPLIFIER

William Yuni, Forest Hills, N. Y., assignor to the United States of America as represented by the Secretary of the Army Application May 4, 1953, Serial No. 353,025

2 Claims. (Cl. 179—171)

(Granted under Title 35, U. S. Code (1952), sec. 266)

The invention described herein may be manufactured and used by or for the Government for governmental purposes, without the payment of any royalty thereon.

Subject invention relates to a variable gain amplifier or modulator and particularly to an amplifier providing a wide range of gain either in phase or out of phase with the control signal. More particularly, this invention relates to an amplifier whose gain may be varied linearly with control voltage. This invention also relates to an amplifier whose gain may be controlled from a remote point.

The standard system of gain control usually consists of vacuum tubes, preferably of the remote cut-off variety, whose gain is varied by a change in the bias of the control grid. Other variations and circuits including this function are used for automatic gain control and in volume expansion and compression for audio frequency amplifiers. In this type of circuit, as the bias of control grid is made more negative, there is a decrease in the gain of the tube. As the bias on the control grid approaches zero, the gain is increased until the grid starts to conduct. Unfortunately, the very factor that provides the variation in gain of a tube along with a variation in the control grid bias also introduces a substantial amount of distortion and in any case, the gain of the tube can be varied only in one phase and not over a wide range.

It is, therefore, an object of this invention to provide a variable gain amplifier whose output may be controlled either in phase or out of phase with the corresponding input signal.

It is a further object of this invention to provide a variable gain amplifier having a wide range of gain control.

It is a further object of this invention to provide a variable gain amplifier using electronic tubes.

It is a further object of this invention to provide an amplifier whose gain may be varied substantially linearly with respect to a control voltage from zero gain to the maximum normal gain of the tube in this circuit.

It is a further object of this invention to provide a variable gain amplifier that may be controlled from a remote point.

It is a further object of this invention to provide a variable gain amplifier whose response characteristics may be made substantially independent of frequency or controlled in any desired way over a wide band including the audible frequency spectrum.

Other and further objects of this invention will become apparent from the following specifications and drawing in which a typical circuit embodying this invention is shown.

Referring now particularly to the drawing, a circuit is seen comprising two vacuum tubes 10 and 12 which may be separate triodes or halves of a conventional dual triode tube. This circuit has an input 14 where the signal whose gain is to be controlled is applied. The input signal passes through a limiting resistor 16 to the grid of tube 10. Grid biasing resistor 18 is provided to maintain the mean bias of the grid at ground level. The cathode of tube 10 is coupled to the cathode of tube 12 and both cathodes are returned to ground through resistor 20. The plate of the tube 10 passes through plate load resistance 22 to the source of voltage 24. The tube 12 has its plate load resistor 26 in series with the plate load resistor 22 of tube 10.

In operation, the input to 14 may be supplied from any conventional source such as an audio frequency generator. Since the circuit does not need to have any frequency limitations from coupling condensers, bypass condensers or other RC networks, the frequency response would be limited only by the inherent inductive and capacitance components of the tubes and wiring. These may be compensated to a considerable extent by the simple feedback network shown here to improve the linearity of the frequency response characteristics and gain control characteristics of this circuit over a wider band of frequencies and over the entire range of gain provided by this circuit.

Considering the feedback network, the .02 microfarad condenser, the 330,000 ohm resistor 34 and the 33,000 ohm resistor 18 shown here are chosen to give a reasonably flat frequency response over as wide a range as possible. It is obvious that other feedback networks of relatively greater complexity, more sensitive to certain portions of the frequency spectrum, may be chosen for tone controls to provide fixed or variable boost or losses of high or low frequencies or other characteristics. The input network 16 and 18 provides a load for the feedback network making it substantially independent of input impedance variations.

The way of considering the operation of this circuit which best explains the continuous control from zero to maximum of an output that may be either positive or negative with respect to the input signal is as follows: the cathodes of the tubes 10 and 12 being tied together and grounded through a common resistor 20 provide a cathode follower action between the grid and cathode of tube 10 and a cathode driving action between cathode and grid of tube 12 which is the basis of a well-known phase inverter. In the problem of continuously variable switching between the two opposite output phases in a standard circuit, the question is basically a way of obtaining zero output. If the two plates of the tubes were tied together through a common resistor 22, for example, the output would not be maintained at zero due to the fact that the signal current in tube 12 can never be as great as that in tube 10. The relative change between grid and cathode voltages is much greater in tube 10 than in tube 12; therefore, the output will be determined by tube 10 and will not be balanced. However, the introduction of resistor 26, which is a 25,000 ohm potentiometer, in series with the 10,000 ohm plate load resistor 22, sufficiently balances the voltage between the two branches of the circuit to provide a zero output by proper setting of the control potentiometer 26. A decrease in the amount of the resistance at 26 will result in an out-of-phase output from tube 10. An increase in the resistance 26 will cause an in-phase output voltage from tube 12.

In this particular circuit the tubes are halves of a 12AU7 dual triode with a common cathode resistance of 6,800 ohms. The resistances 16 and 18 are 75,000 and 33,000 ohms respectively, while the resistance 30 is 500,000 ohms.

Once the total voltage contribution from tubes 10 and 12 has been balanced to zero signal output at the plate of tube 12 by suitable adjustment of the resistance 26, the gain of the tube 12 and thereby the relative value of the balancing signal of this branch can be altered by suitable change in the bias of the grid of tube 12 as applied at 31. Thus, if the control voltage on 31 is made more negative, the gain in 12 is decreased and the effect of the amplification of tube 10 becomes more apparent at the output 28 providing an out-of-phase signal with respect to the input at 14. On the other hand, if the control voltage on the grid at 31 is increased the gain of tube 12 is increased and the output voltage at terminal 28 will be more affected by tube 12 than by tube 10 to provide an output signal in phase with the input signal at 14.

The applications of this circuit for audio frequency use are quite apparent. The overall gain of the circuit may be increased or decreased while maintaining a substantially linear output to provide suitable gain for a wide range of inputs.

Circuits designed for use with several types of inputs normally require additional stages of gain as well as compensation networks to provide the proper output. In this circuit the gain can be controlled within suitable ranges and the necessary compensation to provide the desired frequency response characteristics may be applied in the feedback network within the same stage of amplification.

Since the output of this circuit may be considered to consist of the products of the signal inputs 14 and control input 31, the circuit can be used as an electronic multiplier or a D. C. to A. C. signal converter. In this respect the circuit may be considered as a modulator, the A. C. input at 14 being modulated by a lower frequency A. C. or slowly varying D. C. at 31. In this application, the output signal at 28 and the output phase are both dependent on the D. C. signal.

This circuit has considerable potential use in servo systems where a frequency in the power range is to be applied to a varying degree in one or both phases to suitably control the motion of a driving motor at a distant point. Suitable motion of the object being driven can be relayed back to the control point and compared with the control voltage which is calibrated to provide a zero control voltage for a given position of the object being driven.

Preferred embodiments of the invention have been described in slightly simplified form to facilitate an understanding of the features of the invention, but many variations will be apparent to those skilled in the art.

What is claimed is:

1. A variable gain amplifier comprising a first and a second vacuum tube each tube having at least an anode, a cathode and a control grid, means electrically connecting the cathode of said first vacuum tube to the cathode of said second vacuum tube, a first resistor connecting said cathodes to a source of ground potential, a second resistor connected between the anode of said first vacuum tube and a source of positive potential, a variable resistor connected between the anode of said first vacuum tube and the anode of said second vacuum tube to provide the only source of positive potential for said second vacuum tube, a grid biasing resistor connected between the control grid of said first vacuum tube and said source of ground potential, means connected to the control grid of said first vacuum tube for supplying an input signal and means connecting the anode of said second vacuum tube to an output terminal whereby the amplification of the signal applied at said input terminal can be controlled by adjusting the bias potential on the control grid of said second vacuum tube and the phase relation between the input signal and the output signal can be controlled by means of said variable resistor.

2. In the circuit as in claim 1, a third resistor, a condenser, one end of said third resistor connected to one end of said condenser, the other end of said third resistor connected to the grid of said first vacuum tube, and the other end of said condenser connected to the anode of said second vacuum tube.

References Cited in the file of this patent

UNITED STATES PATENTS

| | | |
|---|---|---|
| 2,092,496 | Branson | Sept. 7, 1937 |
| 2,162,878 | Brailsford | June 20, 1939 |
| 2,284,102 | Rosencrans | May 26, 1942 |
| 2,396,224 | Artzt | Mar. 12, 1946 |
| 2,419,812 | Bedford | Apr. 29, 1947 |
| 2,464,594 | Mahoney | Mar. 15, 1949 |
| 2,516,865 | Ginzton | Aug. 1, 1950 |

FOREIGN PATENTS

| | | |
|---|---|---|
| 630,123 | Great Britain | Oct. 5, 1949 |